United States Patent
Nam et al.

(10) Patent No.: US 9,551,925 B2
(45) Date of Patent: Jan. 24, 2017

(54) BLANKMASK AND PHOTOMASK USING THE SAME

(71) Applicant: S&S TECH CO., LTD, Daegu (KR)

(72) Inventors: Kee-Soo Nam, Daegu (KR); Chul-Kyu Yang, Daegu (KR); Geung-Won Kang, Daegu (KR); Cheol Shin, Daegu (KR); Jong-Hwa Lee, Daegu (KR); Min-Ki Choi, Daegu (KR); Chang-Jun Kim, Daegu (KR); Kyu-Jin Jang, Daegu (KR)

(73) Assignee: S&S TECH CO., LTD, Daegu (KR)

( * ) Notice: Subject to any disclaimer, the term of this patent is extended or adjusted under 35 U.S.C. 154(b) by 131 days.

(21) Appl. No.: 14/604,247

(22) Filed: Jan. 23, 2015

(65) Prior Publication Data
US 2015/0268552 A1 Sep. 24, 2015

(30) Foreign Application Priority Data
Mar. 23, 2014 (KR) .................. 10-2014-0033765

(51) Int. Cl.
*G03F 1/48* (2012.01)
*G03F 1/26* (2012.01)
*G03F 1/80* (2012.01)

(52) U.S. Cl.
CPC . *G03F 1/48* (2013.01); *G03F 1/26* (2013.01); *G03F 1/80* (2013.01)

(58) Field of Classification Search
CPC ..................................... G03F 1/48; G03F 1/26
USPC ........................................................ 430/5
See application file for complete search history.

(56) References Cited

U.S. PATENT DOCUMENTS

| | | | |
|---|---|---|---|
| 6,576,374 B1* | 6/2003 | Kim | ........................ G03F 1/30 430/323 |
| 2008/0206655 A1* | 8/2008 | Nozawa | ................ B82Y 10/00 430/5 |
| 2014/0004449 A1* | 1/2014 | Nam | ........................ G03F 1/50 430/5 |

FOREIGN PATENT DOCUMENTS

| | | |
|---|---|---|
| CN | 101950125 A | 1/2011 |
| JP | 2010002853 A | 1/2010 |
| JP | 2010044275 A | 2/2010 |
| JP | 2013171273 A | 9/2013 |
| JP | 2013225122 A | 10/2013 |
| KR | 1020060003150 A | 1/2006 |
| KR | 1020070066809 A | 6/2007 |
| KR | 1020070096922 A | 10/2007 |
| KR | 1020100002067 A | 1/2010 |
| KR | 101269062 B1 | 5/2013 |

(Continued)

*Primary Examiner* — Stephen Rosasco
(74) *Attorney, Agent, or Firm* — William Park & Associates Ltd.

(57) ABSTRACT

A blankmask and a photomask using the same are provided. The blankmask can be useful in preventing the loss in thickness of lateral, top and bottom surfaces of a pattern of a light shielding film or a phase shifting film after the manufacture of the photomask by forming protective film, which has an etch selectivity with respect to a pattern of a hard film or the light shielding film, on the light shielding film or the phase shifting film so that the loss of the phase shifting film formed under the light shielding film or the phase shifting film can be prevented when a process of removing the light shielding film disposed under the hard film or a pattern of the light shielding film is performed during a washing process and a process of removing a pattern of the hard film in a method of manufacturing a photomask, thereby securing uniformity in thickness.

13 Claims, 1 Drawing Sheet

(56) References Cited

FOREIGN PATENT DOCUMENTS

TW          201321887 A1    6/2013
TW          201400975 A     1/2014

* cited by examiner

BLANKMASK AND PHOTOMASK USING THE SAME

CROSS-REFERENCE TO RELATED APPLICATION

This application claims priority to and the benefit of Korean Patent Application No. 10-2014-0033765, filed on Mar. 23, 2014, the disclosure of which is incorporated herein by reference in its entirety.

BACKGROUND

1. Field of the Invention

The present invention relates to a blankmask and a photomask using the same, and more particularly, to a blankmask having a hard film formed therein for realizing a pattern having a half-pitch of 32 nm or less, particularly 20 nm or less, and a photomask using the same.

2. Discussion of Related Art

Today, ultrafine processing technology for semiconductors has emerged as a very important factor to meet the need for fine circuit patterns accompanied by high integration of large-scale integrated circuits (ICs). In the case of highly integrated circuits, circuit wires become finer for the purpose of low power consumption and high-speed operations, and there are growing technical demands for contact hole patterns for interlayer connections, circuit arrangement for high integration, etc. Therefore, in the manufacture of the photomask on which an original circuit pattern is recorded, lithography technology capable of forming finer circuit patterns and recording more precise circuit patterns on the photomask is required so as to meet such demands.

Binary blankmasks using a light shielding film, and phase shifting blankmasks using a phase shifting film and a light shielding film are commercially available as raw materials for photomasks manufactured using the lithography technology. Further, blankmasks further including a hard film have been developed in recent years.

In the case of the blankmasks including the hard film among the above-described blankmasks, the structures of binary blankmasks using a molybdenum silicide (MoSi) compound as a light screening film, and the structures of phase shifting blankmasks using a molybdenum silicide (MoSi) compound as a phase shifting film and a chromium (Cr) compound as the light screening film have been generally developed.

Meanwhile, a method of manufacturing a photomask using the blankmask including the hard film is performed by patterning a hard film using a resist film disposed on the hard film as an etching mask, etching a metal film disposed below the hard film using a pattern of the hard film as the etching mask, and removing the pattern of the hard film.

In the method of manufacturing a photomask, however, the processes of patterning the lower metal film using the hard film and removing the hard film have the following problems.

Specifically, in the method of manufacturing a photomask, a washing process using chemicals, for example, Standard Cleaning-1 (SC-1), sulfuric acid ($H_2SO_4$), ozone water ($O_3$), and the like is carried out. The washing process has a problem in that a difference in optical density (OD) and critical dimension (CD) uniformity between a central region and an outer region, or a main pattern region and a non-main pattern region occurs as the regions are exposed to a washing material for different times due to a loading effect according to a difference in pattern density between the regions. The difference in optical density and critical dimension on such a photomask affects the critical dimension uniformity of a pattern printed on a wafer due to image contrast enhancement problems during a process of printing a wafer using a photomask.

Also, problems regarding the loading effect occur in a process of removing a pattern of the hard film in the method of manufacturing a photomask. Specifically, after a pattern of a metal film disposed below the hard film using the pattern of the hard film is completely formed, a loading effect in which a time required to remove the hard film is different due to the difference in density between a central region and an outer region, or a main pattern region and a non-main pattern region of the pattern of the hard film occurs during the process of removing the pattern of the hard film. Therefore, a difference in optical density and critical dimension between the regions occurs since a time for which the pattern of the metal film formed below the hard film is exposed to the etching material is different due to the difference in density of the pattern of the metal film. Finally, the difference in optical density and critical dimension on such a photomask results in critical dimension ununiformity at a wafer level and a process margin problem during a process of printing a wafer using a photomask.

The same problems occur in the phase shifting photomask as well as the binary photomask formed using the hard film. Particularly, the problems are increasingly issued as the size of the pattern becomes finer.

SUMMARY OF THE INVENTION

The present invention is directed to a blankmask capable of preventing the loss of a pattern of a light shielding film disposed below a hard film during a washing process and a process of removing a pattern of the hard film in a method of manufacturing a photomask for purpose of realizing a micropattern having a half-pitch of 32 nm or less, particularly 20 nm or less, or the loss of a pattern of a phase shifting film disposed below the light shielding film during a process of removing a pattern of the light shielding film, and a photomask using the same.

Also, the present invention is directed to a blankmask capable of minimizing a difference in optical density and critical dimension uniformity according to pattern density by preventing the loss of the patterns of the light shielding film and the phase shifting film disposed below the hard film during a washing process and a process of removing the pattern of the hard film or the light shielding film disposed on the phase shifting film, and a photomask using the same.

According to an aspect of the present invention, there is provided a blankmask including a light shielding film provided on a transparent substrate, a hard film provided on a top surface of the light shielding film, and a protective film disposed between the light shielding film and the hard film and configured to prevent the loss in thickness of the light shielding film by a washing agent used in a method of manufacturing a photomask, and an etching material used to remove the hard film.

According to another aspect of the present invention, there is provided a blankmask including a light shielding film provided on a transparent substrate, and a hard film provided on a top surface of the light shielding film. Here, the top surface of the light shielding film has a higher oxygen (O) content than a bottom surface of the light shielding film to prevent the loss in thickness of the light shielding film by a washing agent used in a method of manufacturing a photomask, and an etching material used to remove the hard film.

According to still another aspect of the present invention, there is provided a blankmask including a phase shifting film provided on a transparent substrate, and a light shielding film provided on a top surface of the phase shifting film. Here, the blankmask further includes a protective film provided between the phase shifting film and the light shielding film and configured to prevent the loss in thickness of the phase shifting film by a washing agent used in a method of manufacturing a photomask, and an etching material used to remove the light shielding film.

According to yet another aspect of the present invention, there is provided a blankmask including a phase shifting film provided on a transparent substrate, and a light shielding film provided on a top surface of the phase shifting film. Here, the top surface of the light shielding film has a higher oxygen (O) content than a bottom surface of the light shielding film to prevent the loss in thickness of the phase shifting film by a washing agent used in a method of manufacturing a photomask, and an etching material used to remove the light shielding film.

The light shielding film has a multi-layered film structure in which a light screening film and an anti-reflection film are stacked, a single-layered film structure, or a continuous film structure in which composition rates are continuously altered.

The light shielding film may be made of at least one metal material selected from the group consisting of chromium (Cr), molybdenum (Mo), titanium (Ti), tantalum (Ta), tungsten (W), tin (Sn), and hafnium (Hf), or may further include at least one material selected from the group consisting of silicon (Si), oxygen (O), carbon (C), and nitrogen (N) in addition to the metal material, and the light shielding film may be made of a compound containing silicon (Si). In this case, the light shielding film in which a ratio of a content of the metal material to a content of silicon (Si) is in a range of 0.01 to 0.3 may have a thickness of 10 nm to 65 nm.

The protective film may be made of at least one material selected from the group consisting of molybdenum (Mo), tantalum (Ta), aluminum (Al), and silicon (Si), or may further include at least one light element selected from the group consisting of oxygen (O), carbon (C), and nitrogen (N) in addition to the material. Among the materials, the contents of the metal, oxygen (O), silicon (Si) and light element may be in a range of 0 atomic % to 10 atomic %, 10 atomic % to 80 atomic %, 10 atomic % to 80 atomic %, and 0 atomic % to 60 atomic %, respectively.

The protective film may have an etch selectivity of 10 or more with respect to the hard film, and may be etched by the same etching material used to remove the light shielding film.

The protective film may serve as an anti-reflection layer.

The protective film may have an etch selectivity of 10 or more with respect to the light shielding film, and may be etched by the same etching material used to remove the phase shifting film.

The protective film may serve as a phase shifting layer.

The protective film may have a thickness of 0.5 nm to 20 nm, and may have one structure selected from the group consisting of a single-layered film structure, a multi-layered film structure, a single-film structure, and a continuous film structure.

The hard film may have a thickness of 2 nm to 10 nm.

The hard film may be made of at least one material selected from the group consisting of chromium (Cr), silicon (Si), molybdenum (Mo), and tantalum (Ta), or may further include at least one light element selected from the group consisting of oxygen (O), carbon (C), and nitrogen (N) in addition to the material.

The blankmask may further include a hard film provided on the light shielding film.

The phase shifting film may be made of a molybdenum silicide (MoSi) compound including at least one light element selected from the group consisting of oxygen (O), nitrogen (N), carbon (C), and boron (B), and may have a composition rate at which molybdenum (Mo), silicon (Si) and the light element are present at a content of 0.3 atomic % to 10 atomic %, 10 atomic % to 80 atomic %, and 20 atomic % to 60 atomic %, respectively.

The phase shifting film may have a thickness of 30 nm to 65 nm.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Exemplary embodiments of the present invention will be described in detail below with reference to the accompanying drawings. However, it is apparent that the detailed description provided herein is merely used for purposes of describing example embodiments of the present invention, but is not intended to limit the scope of the present invention. Therefore, it should be understood by those skilled in the related art that exemplary embodiments of the present invention may be embodied in many alternate forms and equivalents. Accordingly, the technical scope of the present invention should be defined by the technical features of the appended claims.

Figure 1:
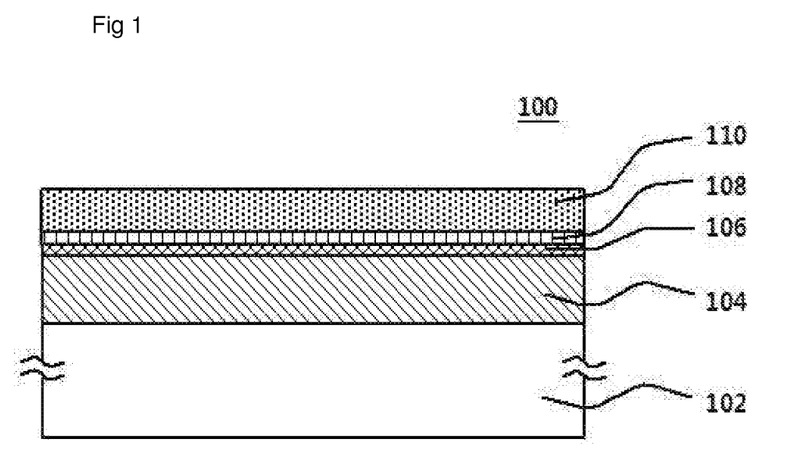
FIG. 1 is a cross-sectional view showing a blankmask according to a first exemplary embodiment of the present invention.

FIG. 1 is a cross-sectional view showing a blankmask according to a first exemplary embodiment of the present invention.

Referring to FIG. 1, the blankmask 100 according to one exemplary embodiment of the present invention includes a transparent substrate 102, and a light shielding film 104, a protective film (i.e., a capping layer) 106, a hard film 108 and a resist film 110, all of which are sequentially disposed on the transparent substrate 102.

The transparent substrate 102 is formed of quartz glass, synthetic quartz glass, or fluorine-doped quartz glass which has a size of 6 inches×6 inches×0.25 inches (width×length×height), and has a birefringence of 2 nm/0.25 inches or less, preferably, 1 nm/0.25 inches or less. A desired critical dimension (CD) of a pattern of a photomask formed using the blankmask 100 according to one exemplary embodiment of the present invention is a half-pitch of 32 nm or less, more preferably 20 nm or less upon final wafer printing. However, the size of the highly fine pattern as described above results in a reduction in focus margin upon wafer exposure, which makes it difficult to realize a process window. Therefore, a substrate preferably has a flatness of 0 so as to physically secure a process window margin. However, the substrate having such a flatness may not be substantially processed. Accordingly, when it is assumed that the flatness is defined as a total indicated reading (TIR) value to secure a high process window margin within a minimum range, the substrate has a flatness corresponding to a TIR value of 500 nm or less, preferably 300 nm or less, and more preferably 200 nm or less at a 142 mm$^2$ region.

The light shielding film 104, the protective film 106 and the hard film 108 may be formed by various methods using a physical or chemical vapor deposition method. For example, a film may be formed using at least one method such as chemical vapor deposition (CVD), DC sputtering, DC magnetron sputtering, RF sputtering, or ion beam sputtering. Also, a thin film may be formed using a sputtering method such as a method using a single target, or a co-sputtering method of installing a plurality of targets together to form a film.

The light shielding film 104 preferably has a multi-layered film structure including a light shielding layer and an anti-reflection layer. Here, the light shielding film 104 may have a single-layered film structure, or a continuous film structure in which composition rates are continuously altered, or may have a multi-layered film structure in which thin films are stacked in the form of a continuous film.

The light shielding film 104 may be formed of at least one metal material selected from the group consisting of chromium (Cr), molybdenum (Mo), titanium (Ti), tantalum (Ta), tungsten (W), tin (Sn), and hafnium (Hf), and may further include at least one material selected from the group consisting of silicon (Si), oxygen (O), carbon (C), and nitrogen (N) in addition to the metal material. The light shielding film 104 should have an etch selectivity with respect to the hard film 108 disposed thereon, and may, for example, be formed of a molybdenum silicide (MoSi) compound containing molybdenum (Mo), silicon (Si), and nitrogen (N). In this case, the light shielding film 104 preferably has a double-layered structure including a light shielding layer and an anti-reflection layer, the light shielding layer is made of MoSiN, and the anti-reflection layer is made of MoSiN, or MoSiON. The light shielding film 104 may be formed of a molybdenum silicon (MoSi) alloy target, or a molybdenum (Mo) or silicon (Si) single target. In the case of the molybdenum silicon (MoSi) alloy target, the target has a composition rate at which molybdenum (Mo) and silicon (Si) are present at a ratio of 0.01 to 0.3:1.

When the light shielding film 104 is thick, the fidelity of a pattern of the light shielding film may be degraded, resulting in complicated optical proximity correction. Such a problem gets complicated as the size of the pattern gets finer. As a result, many errors in a process occur, resulting in a decrease in yield. To solve this problem, the light shielding film 104 is preferably thin. However, it is substantially difficult to manufacture the light shielding film 104 having a certain thickness since a predetermined optical density (OD) of the light shielding film 104 should be satisfied. Therefore, the light shielding film 104 has a thickness of 65 nm or less, preferably, 55 nm or less, and more preferably 50 nm or less.

The light shielding film 104 has an optical density of 2.5 to 3.5 with respect to exposure light with a wavelength of 193 nm. Here a degree of uniformity in optical density is less than or equal to 0.1 at an in-plane 142 mm$^2$ region. The light shielding film 104 is formed in an amorphous structure, and has a composition rate at which a ratio of a content of the metal to a content of silicon (Si) is in a range of 0.01 to 0.3:1.

The TIR absolute value of the light shielding film 104 is less than or equal to 500 nm, and a change in flatness of the light shielding film 104 with respect to the transparent substrate 102 (TIR of the light screening film TIR-TIR of the transparent substrate) is less than or equal to 200 nm, preferably 100 nm. Also, the light shielding film 104 has a surface roughness of 0.3 nmRMS or less.

The light shielding film 104 may be selectively subjected to surface treatment after film formation. In this case, the surface treatment is performed using an apparatus including a vacuum rapid thermal processing system, a hot-plate thermal processing system, or a cooling system.

The protective film 106 serves to prevent the loss of a pattern of the light shielding film 104 by a washing agent and an etching material used to remove the hard film 108 during a washing process and a process of removing the hard film 108 in the method of manufacturing a blankmask 100. That is, the protective film 106 prevents the pattern of the light shielding film 104 from being damaged by the etching material used to remove the hard film 108 so as to prevent the optical density (OD) and critical dimension (CD) uniformity of the pattern of the light shielding film 104 from being degraded when the thicknesses of lateral, top and bottom surfaces of the pattern of the light shielding film 104 are lost due to a loading effect according to the pattern density of the light shielding film 104.

The protective film 106 is formed of a material having a characteristic of being etched in a single process together with the light shielding film 104 disposed below the protective film 106 in the method of manufacturing a photomask using the blankmask 100.

The protective film 106 is formed of at least one material selected from the group consisting of molybdenum (Mo), tantalum (Ta), aluminum (Al), and silicon (Si), and further includes at least one light element selected from the group consisting of oxygen (O), carbon (C), and nitrogen (N) in addition to the material. When the protective film 106 includes the metal material among the materials, the protective film 106 is formed of a compound essentially containing oxygen (O). In this case, the protective film 106 includes at least one metal material selected from the group consisting of molybdenum (Mo), tantalum (Ta), and aluminum (Al) at a content of 0 atomic % to 10 atomic %, oxygen (O) at a content of 10 atomic % to 80 atomic %, silicon (Si) at a content of 10 atomic % to 80 atomic %, and the remaining light element at a content of 0 atomic % to 60 atomic %. Also, the protective film 106 may be formed of a compound essentially containing silicon (Si) and oxygen (O) such as SiO, SiON, SiCO, and SiCON. In this case, the content of silicon (Si) is in a range of 20 atomic % to 80 atomic %, the content of oxygen (O) is in a range of 20 atomic % to 80 atomic %, and the content of the remaining light element is in a range of 0 atomic % to 60 atomic %.

The protective film 106 may be provided on the light shielding film 104 to serve as an anti-reflection layer of the light shielding film 104. Here, when the light shielding film 104 is formed in a single-layered structure, a continuous film structure, or a multi-layered structure, for example, formed of MoSiN, the protective film 106 may have an etch selectivity with respect to the hard film 108, and also may be formed of at least one selected from the group consisting of MoSiON, MoSiO, SiO, and SiON so as to serve as an anti-reflection layer. In this case, the protective film 106 may be formed of a molybdenum silicide (MoSi) alloy target, or a single target of molybdenum (Mo) and silicon (Si).

The protective film 106 may have a thickness of 0.5 nm to 20 nm, preferably 1 nm to 5 nm, and may have a single-layered film structure, a multi-layered film structure, a single-film structure, or a continuous film structure. The stacked structure of the protective film 106 and the light shielding film 104 has an optical density of 2.5 to 3.5, and a surface reflectivity of 35% or less at an exposure wavelength of 193 nm.

Further, the protective film 106 may be selectively removed when pattern formation using the blankmask 100 is finally completed.

The hard film 108 serves as an etching mask for the light shielding film 104 disposed below the protective film 106 in the method of manufacturing a photomask using the blankmask 100. For this purpose, the hard film 108 has an etch selectivity of 10 or more, preferably, 20 or more, and more preferably, 50 or more with respect to the light shielding film 104 and the protective film 106. The hard film 108 has a thickness of 2 nm to 10 nm, preferably a thickness of 3 nm to 5 nm.

The hard film 108 is formed of at least one material selected from the group consisting of chromium (Cr), silicon (Si), molybdenum (Mo), and tantalum (Ta) so that the hard film 108 has an etch selectivity with respect to the light shielding film 104 and the protective film 106, or further include at least one light element selected from the group consisting of oxygen (O), carbon (C), and nitrogen (N) in addition to the material. The hard film 108 may, for example, be formed of chromium (Cr) alone, or formed of a chromium (Cr) compound such as CrN, CrC, CrO, CrCO, CrON, CrCN, or CrCON. Also, when the hard film 108 has an etch selectivity with respect to the protective film 106 disposed below the hard film 108, for example, the hard film 108 may be formed of silicon (Si) alone, or formed of a silicon (Si) compound such as SiN, SiC, SiO, SiCO, SiON, SiCN, or SiCON. In addition, the hard film 108 may be formed of a metal silicide compound including one or more of the metal material, silicon (Si) and the light element.

The hard film 108 may be selectively removed after a pattern of a light screening film is completely formed in the method of manufacturing a photomask.

The resist film 110 is used as an etching mask for the hard film 108 disposed below the resist film 110, preferably a chemically amplified resist. The resist film 110 has a thickness of 40 nm to 120 nm, and an aspect ratio of a pattern width of the light shielding film 104, which is formed below the resist film 110 in the manufacture of the photomask, to the thickness of the resist film 110 is less than or equal to 2.

Figure 2:
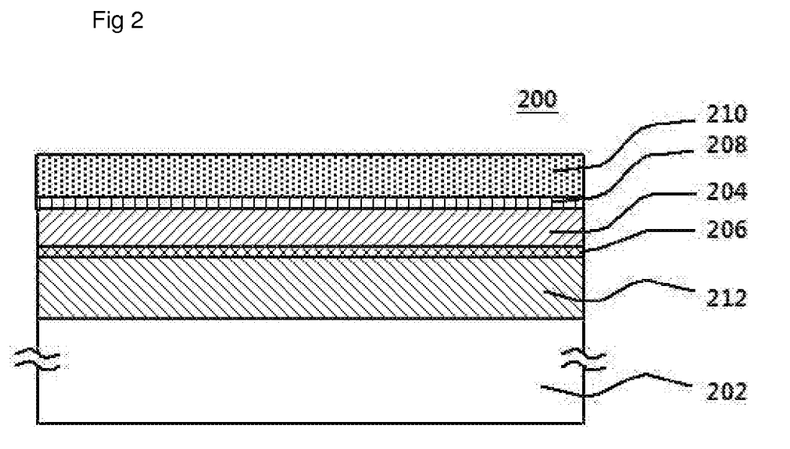
FIG. 2 is a cross-sectional view showing a blankmask according to a second exemplary embodiment of the present invention.

FIG. 2 is a cross-sectional view showing a blankmask according to a second exemplary embodiment of the present invention.

Referring to FIG. 2, the blankmask 200 according to one exemplary embodiment of the present invention includes a transparent substrate 202, and a phase shifting film 212, a light shielding film 204, a protective film 206, a hard film 208 and a resist film 210, all of which are sequentially disposed on a top surface of the transparent substrate 202. Here, the transparent substrate 202, the hard film 208 and the resist film 210 have the same configurations as described above in the first exemplary embodiment.

The phase shifting film 212 is etched using a pattern of the light shielding film disposed on the phase shifting film 212 as an etching mask in the manufacture of the photomask. In this case, the phase shifting film 212 is etched in a single process together with the protective film 206 disposed on the phase shifting film 212 by the same etching material. For this purpose, the phase shifting film 212 is made of a compound containing at least one light element selected from the group consisting of oxygen (O), nitrogen (N), carbon (C), and boron (B), for example, one molybdenum silicide (MoSi) compound selected from the group consisting of MoSi, MoSiO, MoSiN, MoSiC, MoSiON, MoSiCN, MoSiOC, MoSiCON, MoSiB, MoSiBO, MoSiBN, MoSiBC, MoSiBON, MoSiBCN, MoSiBOC, and MoSiBCON, so that the phase shifting film 212 has etching characteristics similar to the protective film 206.

The phase shifting film 212 is formed by adjusting the composition rates of molybdenum (Mo), silicon (Si) and the light element included in the phase shifting film 212 so as to satisfy desired transmissivity and phase shift, and has a composition rate at which molybdenum (Mo), silicon (Si), and the light element are present at a content of 0.3 atomic % to 10 atomic %, 10 atomic % to 80 atomic %, and 20 atomic % to 60 atomic %, respectively.

The phase shifting film 212 has a thickness of 30 nm to 65 nm, preferably a thickness of 40 nm to 50 nm. The phase shifting film 212 has a transmissivity of 3% to 15%, preferably a transmissivity of 3% to 15%, and a phase shift amount of 150° to 190° with respect to exposure light with a wavelength of 193 nm.

The light shielding film 204 is patterned using a pattern of the hard film 208 disposed on the light shielding film 204 as an etching mask to form a pattern of the light shielding film 204 in the manufacture of the photomask, and is made of a material having an etch selectivity of at least 10 or more with respect to the hard film 208, the protective film 206 and the phase shifting film 206 as patterns of the protective film 206 and the phase shifting film 212 disposed below the light shielding film 204 are used as etching masks. For this purpose, the light shielding film 204 is formed of at least one metal material selected from the group consisting of chromium (Cr), molybdenum (Mo), titanium (Ti), tantalum (Ta), tungsten (W), tin (Sn), and hafnium (Hf), or further include at least one light element selected from the group consisting of silicon (Si), oxygen (O), carbon (C), and nitrogen (N) in addition to the metal material.

Specifically, the light shielding film 204 may be made of a compound containing at least one light element selected from the group consisting of chromium (Cr), tin (Sn), tantalum (Ta), chromium (Cr) and tin (Sn), chromium (Cr) and tantalum (Ta), tin (Sn), and tantalum (Ta) to accelerate an etching rate while maintaining a light shielding property, and may further include silicon (Si) in addition to the materials. The light shielding film 106 is, for example, made of at least one selected from the group consisting of Cr, CrN, CrO, CrC, CrON CrCN, CrCO, CrCON, Sn, SnN, SnO, SnC, SnON SnCN, SnCO, SnCON, Ta, TaN, TaO, TaC, TaON TaCN, TaCO, TaCON, CrSn, CrSnC, CrSnO, CrSnN, CrSnCO, CrSnCN, CrSnON, CrSnCON, CrTa, CrTaC, CrTaO, CrTaN, CrTaCO, CrTaCN, CrTaON, CrTaCON, SnTa, SnTaC, SnTaO, SnTaN, SnTaCO, SnTaCN, SnTaON, and SnTaCON. Also, the light shielding film 106 may be made of a MoSi compound or a MoTaSi compound in which the ratio of the light element is adjusted to have an etch selectivity with respect to the phase shifting film 212.

The light shielding film 204 preferably has a multi-layered film structure including a light screening film and an anti-reflection film. In this case, when the light shielding film 204 has an anti-reflection function, the light shielding film 204 has a single-layered film structure, a continuous film structure in which composition rates are continuously altered, or a multi-layered film structure in which thin films are stacked in the form of a continuous film.

In the configuration in which the light shielding film 204 is stacked with the phase shifting film 212 disposed below the light shielding film 204, the light shielding film 204 has an optical density of 2.5 to 3.5. Thus, the light shielding film 204 has a thickness of 10 nm to 45 nm, preferably a thickness of 15 nm to 30 nm, and has the same other optical and physical characteristics as disclosed in the first exemplary embodiment.

The protective film 206 serves to prevent the phase shifting film 212 from being lost by a washing agent and an etching material used to remove the light shielding film 204 during a washing process and a process of removing a pattern of the light shielding film 204 disposed on the protective film 206 in the method of manufacturing a photomask using the blankmask 200. That is, the protective film 206 prevents a pattern of the phase shifting film 212 from being damaged by the etching material used to remove the light shielding film 204 so as to prevent optical characteristics of the optical density (OD) and critical dimension (CD) uniformity of the pattern of the phase shifting film 212 from being degraded when the thicknesses of lateral, top and bottom surfaces of the phase shifting film 212 are lost due to a loading effect according to the pattern density of the phase shifting film 212.

In addition, the protective film 206 is formed of a film having a phase shifting function given thereto, and thus may serve as a phase shifting layer together with the phase shifting film 212 disposed below the protective film 206.

Specifically, when the protective film 206 serves as a phase shifting layer, the protective film 206 is made of at least one material selected from the group consisting of molybdenum (Mo), tantalum (Ta), aluminum (Al), and silicon (Si), or essentially includes oxygen (O) in addition to the material. Also, the protective film 206 further includes at least one light element selected from the group consisting of carbon (C), and nitrogen (N). In this case, the protective film 206 has a composition rate at which the metal material, oxygen (O), silicon (Si) and the remaining light element are present at a content of 0 atomic % to 10 atomic %, 10 atomic % to 80 atomic %, 10 atomic % to 80 atomic %, and 0 atomic % to 60 atomic %, respectively. Also, the protective film 206 has a thickness of 0.5 nm to 20 nm, has a single-layered film structure, a multi-layered film structure, a single-film structure, or a continuous film structure. In this case, the protective film 206 has a characteristic of being etched by the same etching material used to remove the phase shifting film 206.

Further, the protective film 206 may be selectively removed when the pattern formation using the photomask 200 is completed.

Hereinafter, the phase shifting blankmask according to one exemplary embodiment of the present invention will be described in detail.

EXAMPLES

Manufacture of Binary Blankmask and Photomask (I) Having Protective Film

To manufacture the binary blankmask according to one exemplary embodiment of the present invention, a transparent substrate which had a size of 6 inches×6 inches×0.25 inches and whose flatness (TIR) and birefringence were controlled to be 300 nm or less and 2 nm/0.25 inches, respectively, was prepared.

The transparent substrate was put into a DC magnetron sputtering system containing a target having a composition rate at which Mo and Si were present at a ratio of 10 atomic %:90 atomic %, Ar and $N_2$ were injected at a ratio of 7 sccm:3 sccm as process gases, and a process power of 0.70 kW was then applied to form a light screening film made of MoSiN on the transparent substrate.

Next, Ar and $N_2$ were injected at a ratio of 7 sccm:6.5 sccm as the process gases, and a process power of 0.6 kW was then applied to form an anti-reflection film made of MoSiN, thereby finally forming the light shielding film.

The light shielding film was measured for optical density and reflectivity using n&k Analyzer 3700RT equipment from n&k Technology Inc. As a result, it was revealed that the light shielding film had an optical density of 2.95 and a reflectivity of 33.2% at an exposure wavelength of 193 nm. Also, the thickness of the light shielding film was measured using XRR equipment. As a result, it was revealed that the light shielding film had a thickness of 47.5 nm.

Subsequently, Ar and $O_2$ were injected at a ratio of 5 sccm:10 sccm as process gases into a DC magnetron sputtering system containing a Si target doped with boron (B), and a process power of 0.60 kW was applied to form a SiO protective film having a thickness of 2 nm on the light shielding film.

Thereafter, Ar was injected at a content of 8 sccm as a process gas into a DC magnetron sputtering system containing a chromium (Cr) target, and a process power of 0.70 kW was applied to form a hard film having a thickness of 4 nm on the protective film.

Then, the manufacture of a phase shifting blankmask including the hard film and the protective film was completed by coating a chemically amplified resist film onto the hard film to a thickness of 80 nm.

The resist film of the blankmask was subjected to a lithography process to form a resist pattern, and a pattern of the hard film disposed below the resist film was formed using the resist pattern as an etching mask. Then, the resist pattern was removed, and patterns of the protective film and the light shielding film were formed using the pattern of the hard film as an etching mask. The pattern of the hard film was then removed to complete the manufacture of a photomask.

Also, to check an effect of the protective film, a photomask was manufactured in this Comparative Example 1 by manufacturing a blankmask in which the light shielding film, the hard film and the resist film were formed in the same manner as described above in Example 1, except that no protective film was formed, and subjecting the blankmask to a patterning process.

Among the patterns of the protective film and the light screening film formed in Example 1 and Comparative Example 1, the patterns having a pattern density of 0%, 50%, and 100% were then measured for critical dimension (CD) uniformity, and also measured for optical density with respect to light with a wavelength of 193 nm

TABLE 1

Critical dimension uniformity and optical density of pattern of light shielding film according to pattern density

|  |  | 0% Pattern | 50% Pattern | 100% Patten | Delta |
|---|---|---|---|---|---|
| Example 1 (protective film formed) | Delta CD (Real CD) | 0.8 nm | 1.1 nm | 1.6 nm | 0.8 nm |
|  | O.D @ 193 nm | 2.82 | 2.80 | 2.77 | 0.05 |
| Comparative Example 1 (protective film not formed) | Delta CD (Real CD) | 1.1 nm | 2.5 nm | 4.9 nm | 3.8 nm |
|  | O.D @ 193 nm | 2.81 | 2.72 | 2.65 | 0.16 |

Referring to Table 1, it was confirmed that the blankmask including the protective film prepared in Example 1 had a difference in critical dimension (CD) of approximately 0.8 nm according to the pattern density of the light shielding film, and a difference in optical density (OD) of 0.05 during a washing process and a process of removing the hard film in the method of manufacturing a photomask.

On the other hand, it was confirmed that the blankmask prepared in Comparative Example 1 had a difference in critical dimension (CD) of approximately 3.8 nm according to the pattern density of the light shielding film, and a difference in optical density (OD) of 0.16, indicating that the light shielding film was highly lost during the washing process and the process of removing the hard film.

Therefore, it could be seen that the pattern of the light shielding film had excellent critical dimension (CD) and optical density (OD) since the loss of the pattern of the light shielding film was prevented by the protective film during the washing process and the process of removing the hard film in the method of manufacturing a photomask.

Manufacture of Binary Blankmask and Photomask (II) Having Protective Film

To manufacture the binary blankmask according to one exemplary embodiment of the present invention, a transparent substrate was put into a DC magnetron sputtering system containing a target having a composition rate at which Mo and Si were present at a ratio of 10 atomic %:90 atomic %, Ar and $N_2$ were injected at a ratio of 7 sccm:3 sccm as process gases, and a process power of 0.70 kW was then applied to form a light screening film made of MoSiN on the transparent substrate.

Next, the transparent substrate having the light screening film formed thereon was put into a DC magnetron sputtering system containing a target having a composition rate at which Mo and Si were present at a ratio of 5 atomic %:95 atomic %, Ar, $N_2$ and NO were injected at a ratio of 3 sccm:3 sccm:10 sccm as process gases, and a process power of 0.60 kW was applied to form a protective film made of MoSiON on the light shielding film, thereby finally forming the light screening film. In this case, the protective film also had an anti-reflection function.

The light shielding film was measured for optical density and reflectivity. As a result, it was revealed that the light shielding film had an optical density of 2.97 and a reflectivity of 33.5% at an exposure wavelength of 193 nm. Also, it was revealed that the light shielding film had a thickness of 47.5 nm.

Subsequently, Ar was injected at a content 8 sccm as a process gas, and a process power of 0.70 kW was applied to a DC magnetron sputtering system containing a chromium (Cr) target to form a hard film having a thickness of 4 nm on the light shielding film.

Thereafter, the manufacture of a blankmask including the hard film and the protective film was completed by coating a chemically amplified resist film onto the hard film to a thickness of 80 nm.

Also, the resist film of the blankmask was subjected to a lithography process to form a resist pattern, and a pattern of the hard film disposed below the resist film was formed using the resist pattern as an etching mask. Then, the resist pattern was removed, and a pattern of the light shielding film disposed below the hard film was formed using the pattern of the hard film as an etching mask. The pattern of the hard film was then removed to complete the manufacture of a photomask.

Also, a light screening film made of MoSiN was formed on the transparent substrate in the same manner as described above. Thereafter, the transparent substrate having the light screening film formed thereon was put into a DC magnetron sputtering system containing a Si target, Ar, $N_2$ and NO were added at a ratio of 5 sccm:2 sccm:7 sccm as the process gases, and a process power of 0.70 kW was applied to form a protective film made of SiON on the light screening film, thereby finally forming the light shielding film.

The light shielding film was measured for optical density and reflectivity. As a result, it was revealed that the light shielding film had an optical density of 2.97 and a reflectivity of 33.7% at an exposure wavelength of 193 nm. Also, it was revealed that the light shielding film had a thickness of 48.9 nm.

Subsequently, a hard film and a resist film were formed on the light shielding film in the same manner as described above, and subjected to a patterning process to complete the manufacture of a photomask.

Among the patterns of the light shielding films including the protective film made of MoSiON and SiON prepared in Example 2 and 3, the patterns having a pattern density of 0%, 50%, and 100% were then measured for critical dimension (CD) uniformity, and also measured for optical density with respect to light with a wavelength of 193 nm

TABLE 2

Critical dimension uniformity and optical density of pattern of light shielding film according to pattern density

| | | Protective film material | 0% Pattern | 50% Pattern | 100% Pattern | Delta |
|---|---|---|---|---|---|---|
| Example 2 | Delta CD (Real CD) | MoSiON | 0.7 nm | 1.0 nm | 1.4 nm | 0.7 nm |
| | O.D @ 193 nm | | 2.83 | 2.82 | 2.80 | 0.03 |
| Example 3 | Delta CD (Real CD) | SiON | 0.8 nm | 1.2 nm | 1.5 nm | 0.7 nm |
| | O.D @ 193 nm | | 2.82 | 2.81 | 2.78 | 0.04 |

Referring to Table 2, it was revealed that, when the blankmasks prepared in Examples 2 and 3 had the MoSiON and SiON protective films, the blankmasks including the protective film had a difference in critical dimension (CD) of approximately 0.7 nm according to the pattern density of the light shielding film, and a difference in optical density (OD) of 0.03 and 0.04, respectively, during a washing process and a process of removing the hard film in the method of manufacturing a photomask.

Therefore, it could be seen that the light shielding film was not highly lost during the washing process and the process of removing the hard film.

Manufacture of Binary Blankmask and Photomask (III) Having Protective Film

To manufacture the binary blankmask according to one exemplary embodiment of the present invention, a transparent substrate was put into a DC magnetron sputtering system containing a target having a composition rate at which Mo and Si were present at a ratio of 10 atomic %:90 atomic %, Ar and $N_2$ were injected at a ratio of 5 sccm:5 sccm as process gases, and a process power of 0.70 kW was then applied to form a MoSi-based light shielding film on the transparent substrate. In this case, the light shielding film was formed so that the 0 content increased from a lower portion to an upper portion thereof. Therefore, the light shielding film was formed so that the lower and upper portions of the light shielding film had a composition rate near to MoSiN and MoSiON, respectively.

The light shielding film was measured for optical density and reflectivity. As a result, it was revealed that the light shielding film had an optical density of 2.95 and a reflectivity of 32.1% at an exposure wavelength of 193 nm, and had a thickness of 46.5 nm Therefore, it could be seen that the light shielding film having the continuous film structure had all the light shielding, anti-reflection and protective film functions.

Next, Ar was injected at a content 8 sccm as a process gas, and a process power of 0.70 kW was applied to a DC magnetron sputtering system containing a chromium (Cr) target to form a hard film having a thickness of 4 nm on the light shielding film.

Thereafter, the manufacture of a blankmask including the hard film was completed by coating a chemically amplified resist film onto the hard film to a thickness of 80 nm.

Also, the resist film of the blankmask was subjected to a lithography process to form a resist pattern, and a pattern of the hard film disposed below the resist film was formed using the resist pattern as an etching mask. Then, the resist pattern was removed, and a pattern of the light shielding film disposed below the hard film was formed using the pattern of the hard film as an etching mask. The pattern of the hard film was then removed to complete the manufacture of a photomask.

Among the patterns of the light shielding films prepared in Examples 2 and 3, the patterns having a pattern density of 0%, 50%, and 100% were then measured for critical dimension (CD) uniformity, and also measured for optical density with respect to light with a wavelength of 193 nm

TABLE 3

Critical dimension uniformity and optical density of pattern of light shielding film according to pattern density

|  |  | 0% Pattern | 50% Pattern | 100% Pattern | Delta |
|---|---|---|---|---|---|
| Example 4 | Delta CD (Real CD) | 0.7 nm | 1.1 nm | 1.5 nm | 0.8 nm |
|  | O.D @ 193 nm | 2.81 | 2.80 | 2.79 | 0.02 |

Referring to Table 3, it was revealed that, when the top surface of the light shielding film had a protective film function as described above in Example 4, the blankmask had a difference in critical dimension (CD) of approximately 0.8 nm according to the pattern density of the light shielding film, and an optical density (OD) of 0.02, indicating that the blankmask of Example 4 had the results similar to the blankmask having the protective film formed thereon prepared in Example 1.

Therefore, it could be seen that the light shielding film was not highly lost during the washing process and the process of removing the hard film.

Manufacture of Phase Shifting Blankmask and Photomask (I) Having Protective Film To manufacture the phase shifting blankmask according to one exemplary embodiment of the present invention, a transparent substrate was put into a DC magnetron sputtering system containing a target having a composition rate at which Mo and Si were present at a ratio of 10 atomic %:90 atomic %, Ar and $N_2$ were injected at a ratio of 5 sccm:7 sccm as process gases, and a process power of 0.70 kW was then applied to form a phase shifting film made of MoSiN on the transparent substrate.

Next, Ar, $N_2$ and NO were injected at a ratio of 3 sccm:3 sccm:10 sccm as process gases, and a process power of 0.60 kW was applied to form a protective film made of MoSiON. In this case, the protective film also serves as a protective layer for etching, and a phase shifting layer.

The phase shifting film and the protective film were measured for transmissivity and phase difference. As a result, it was revealed that the phase shifting blankmask had a transmissivity of 5.8% and a phase difference of 181° at an exposure wavelength of 193 nm, and also had a thickness of 59.5 nm.

Subsequently, the transparent substrate having the phase shifting film formed thereon was put into a DC magnetron sputtering system containing a chromium (Cr) target, Ar and $N_2$ were injected at a ratio of 3 sccm:5 sccm, and a process power of 0.6 kW was then applied to form a light screening film made of CrN. Then, Ar, $N_2$ and NO were injected at a ratio of 5 sccm:5 sccm:5 sccm, and a process power of 0.7 kW was applied to form an anti-reflection film made of CrON. In this case, the final light shielding film including the light screening film and the anti-reflection film had a thickness of 49 nm.

Then, the transparent substrate having the light shielding film formed thereon was put into a DC magnetron sputtering system containing a target having a composition rate at which Mo and Si were present at a ratio of 10 atomic %:90 atomic %, Ar was added at a content of 8 sccm as the process gas, and a process power of 0.70 kW was then applied to form a hard film having a thickness of 4 nm.

Thereafter, the manufacture of a phase shifting blankmask including the hard film was completed by coating a chemically amplified resist film onto the hard film to a thickness of 80 nm.

Also, the resist film of the blankmask was subjected to a lithography process to form a resist pattern, and a pattern of the hard film disposed below the resist film was formed using the resist pattern as an etching mask. Thereafter, the resist pattern was removed, and a pattern of the light shielding film disposed below the hard film was formed using the pattern of the hard film as an etching mask. Then, the protective film and the phase shifting film ere etched together to form a pattern of the phase shifting film. In this case, the hard film was removed when the pattern of the phase shifting film was etched. Then, the pattern of the light screening film was removed to complete the manufacture of a photomask.

Also, a blankmask was prepared in Comparative Example 2 by forming films in the same manner as in Example 4, except that no protective film was formed, and subjected to a patterning process to manufacture a photomask.

Among the patterns of the light shielding films prepared in Example 5 and Comparative Example 2, the patterns having a pattern density of 0%, 50%, and 100% were then measured for critical dimension (CD) uniformity, and also measured for phase value with respect to light with a wavelength of 193 nm

TABLE 4

Critical dimension uniformity and phase value of pattern of light shielding film according to pattern density

|  |  | 0% Pattern | 50% Pattern | 100% Patten | Delta |
|---|---|---|---|---|---|
| Example 5 (protective film formed) | Delta CD (Real CD) | 0.8 nm | 1.0 nm | 1.4 nm | 0.6 nm |
|  | Phase value @ 193 nm | 181° | 180° | 178° | 2° |

TABLE 4-continued

Critical dimension uniformity and phase value of pattern of light shielding film according to pattern density

| | | 0% Pattern | 50% Pattern | 100% Patten | Delta |
|---|---|---|---|---|---|
| Comparative Example 2 (protective film not formed) | Delta CD (Real CD) | 1.5 nm | 2.7 nm | 5.4 nm | 3.9 nm |
| | Phase value @ 193 nm | 180° | 175° | 172° | 8° |

Referring to Table 4, it was revealed that the phase shifting film blankmask prepared in Example 5 had a difference in critical dimension (CD) of approximately 0.6 nm according to the pattern density of the phase shifting film, and a difference in phase value of 2° during the washing process and the process of removing the hard film in the method of manufacturing a photomask.

On the other hand, it could be seen that the phase shifting film blankmask prepared in Comparative Example 2 had a difference in critical dimension (CD) of approximately 3.9 nm according to the pattern density of the phase shifting film, and a difference in phase value of 8°, indicating that the phase shifting film was highly lost during the washing process and the process of the removing the light shielding film.

Therefore, the pattern of the light shielding film had excellent critical dimension (CD) and phase value since the loss of the pattern of the light shielding film was prevented by the protective film during the washing process and the process of removing the hard film in the method of manufacturing a photomask.

Manufacture of Phase Shifting Blankmask and Photomask (II) Having Protective Film To manufacture the phase shifting blankmask according to one exemplary embodiment of the present invention, a transparent substrate was put into a DC magnetron sputtering system containing a target having a composition rate at which Mo and Si were present at a ratio of 10 atomic %:90 atomic %, Ar, $N_2$ and NO were injected at a ratio of 5 sccm:2 sccm:0 to 10 sccm as the process gases, and a process power of 0.70 kW was then applied to form a MoSi-based phase shifting film on the transparent substrate. In this case, the phase shifting film was formed so that the O content increased from a lower portion to an upper portion thereof. Therefore, the phase shifting film was formed so that the lower and upper portions of the phase shifting film had a composition rate near to MoSiN and MoSiON, respectively.

The phase shifting film was measured for transmissivity and phase difference. As a result, it was revealed that the phase shifting film had a transmissivity of 5.9% and a phase difference of 181° at an exposure wavelength of 193 nm, and also had a thickness of 58.5 nm Therefore, it could be seen that the phase shifting film having the continuous film structure had all the phase shifting and protective film functions.

Next, a light screening film made of CrN and an anti-reflection film made of CrON were formed on the phase shifting film in the same manner as in Example 4. In this case, the final light shielding film including the light screening film and the anti-reflection film had a thickness of 49 nm.

Subsequently, Ar was injected at a content 8 sccm as a process gas, and a process power of 0.70 kW was applied to a DC magnetron sputtering system containing a chromium (Cr) target to form a hard film having a thickness of 4 nm on the light shielding film.

Thereafter, the manufacture of a blankmask including the hard film was completed by coating a chemically amplified resist film onto the hard film to a thickness of 80 nm.

Also, the resist film of the blankmask was subjected to a lithography process to form a resist pattern, and a pattern of the hard film disposed below the resist film was formed using the resist pattern as an etching mask. Then, the resist pattern was removed, and a pattern of the light shielding film disposed below the hard film was formed using the pattern of the hard film as an etching mask. The protective film and the phase shifting film were then etched together to form a pattern of the phase shifting film. In this case, the hard film was removed when the pattern of the phase shifting film was etched. The pattern of the light screening film was then removed to complete the manufacture of a photomask.

Among the patterns of the light shielding films prepared in Example 6, the patterns having a pattern density of 0%, 50%, and 100% were then measured for critical dimension (CD) uniformity, and also measured for phase value with respect to light with a wavelength of 193 nm

TABLE 5

Critical dimension uniformity and phase value of pattern of light shielding film according to pattern density

| | | 0% Pattern | 50% Pattern | 100% Patten | Delta |
|---|---|---|---|---|---|
| Example 6 | Delta CD (Real CD) | 0.9 nm | 1.1 nm | 1.3 nm | 0.4 nm |
| | Phase value @ 193 nm | 181° | 180° | 179° | 2° |

Referring to Table 5, it was revealed that, when the top surface of the phase shifting film had a protective film function as described above in Example 6, the blankmask had a difference in critical dimension (CD) of approximately 0.4 nm according to the pattern density of the phase shifting film, and a difference in phase value of 2° during the washing process and the process of removing the pattern of the light shielding film in the method of manufacturing a photomask.

Therefore, it could be seen that the pattern of the light shielding film was not highly lost during the washing process and the process of removing the pattern of the light shielding film.

The blankmask according to one exemplary embodiment of the present invention can be useful in preventing the loss in thickness of lateral, top and bottom surfaces of a pattern of a light shielding film or a phase shifting film after the manufacture of the photomask by forming protective film, which has an etch selectivity with respect to a pattern of a hard film or the light shielding film, on the light shielding film or the phase shifting film so that the loss of the phase shifting film formed under the light shielding film or the phase shifting film can be prevented when a process of removing the light shielding film disposed under the hard film or a pattern of the light shielding film is performed during a washing process and a process of removing a pattern of the hard film in a method of manufacturing a photomask, thereby securing uniformity in thickness.

Therefore, the patterns having an excellent degree of precision and a half-pitch of 32 nm or less, particularly 20 nm or less may be formed since the optical characteristics, such as optical density (OD), critical dimension (CD) uniformity and phase shift, of the pattern of the light shielding film or the phase shifting film may be prevented from being degraded.

It will be apparent to those skilled in the art that various modifications can be made to the above-described exemplary embodiments of the present invention without departing from the scope of the invention. Thus, it is intended that the present invention covers all such modifications provided they come within the scope of the appended claims and their equivalents.

What is claimed is:

1. A blankmask comprising:
   a first film provided on a transparent substrate;
   a second film provided on the first film; and
   a protective film disposed between the first film and the second film, and configured to prevent loss of thickness of the first film caused by a washing agent used during manufacturing process of photomask and an etching material used to remove the second film,
   wherein the first film is comprised of a light shielding film having a multi-layered film structure in which a light screening film and antireflection film are stacked, and the second film is comprised of a hard film.

2. The blankmask of claim 1, wherein the light shielding film has a multi-layered film structure, a single-layered film structure, or a continuous film structure in which composition rates are continuously altered.

3. The blankmask of claim 1, wherein the light shielding film is made of at least one metal material selected from the group consisting of chromium (Cr), molybdenum (Mo), titanium (Ti), tantalum (Ta), tungsten (W), tin (Sn), and hafnium (Hf), or further comprises at least one material selected from the group consisting of silicon (Si), oxygen (O), carbon (C), and nitrogen (N) in addition to the metal material, wherein when the light shielding film is made of a compound containing silicon (Si), ratio of a content of the metal material to a content of silicon (Si) is in a range of 0.01 to 0.3.

4. The blankmask of claim 1, wherein the protective film is made of at least one material selected from the group consisting of molybdenum (Mo), tantalum (Ta), aluminum (Al), and silicon (Si), or further comprises at least one light element selected from the group consisting of oxygen (O), carbon (C), and nitrogen (N) in addition to the material, and, among the materials, contents of the metal, oxygen (O), silicon (Si) and light element are in a range of 0 atomic % to 10 atomic %, 10 atomic % to 80 atomic %, 10 atomic % to 80 atomic %, and 0 atomic % to 60 atomic %, respectively.

5. The blankmask of claim 1, wherein the protective film has an etch selectivity of 10 or more with respect to the second film, and is etched by the same etching material used to remove the first film.

6. The blankmask of claim 1, wherein the light shielding film has a thickness of 10 nm to 65 nm.

7. The blankmask of claim 1, wherein the protective film has a thickness of 0.5 nm to 20 nm, and has one structure selected from the group consisting of a single-layered film structure, a multi-layered film structure, a single-film structure, and a continuous film structure.

8. The blankmask of claim 1, wherein the hard film has a thickness of 2 nm to 10 nm.

9. The blankmask of claim 1, wherein the hard film is made of at least one material selected from the group consisting of chromium (Cr), silicon (Si), molybdenum (Mo), and tantalum (Ta), or further comprises at least one light element selected from the group consisting of oxygen (O), carbon (C), and nitrogen (N) in addition to the material.

10. A photomask manufactured using the blankmask defined in claim 1.

11. A blankmask comprising:
    a first film provided on a transparent substrate;
    a second film provided on the first film; and
    a protective film disposed between the first film and the second film, and configured to prevent loss of thickness of the first film caused by a washing agent used during manufacturing process of photomask and an etching material used to remove the second film,
    wherein the first film is comprised of a phase shifting film, and the second film has a multi-layered film structure in which a light screening film and antireflection film are stacked.

12. The blankmask of claim 11, wherein the phase shifting film has a thickness of 30 nm to 65 nm.

13. The blankmask of claim 11, wherein the phase shifting film is made of a molybdenum silicide (MoSi) compound comprising at least one light element selected from the group consisting of oxygen (O), nitrogen (N), carbon (C), and boron (B), and has a composition rate at which molybdenum (Mo), silicon (Si) and the light element are present at a content of 0.3 atomic % to 10 atomic %, 10 atomic % to 80 atomic %, and 20 atomic % to 60 atomic %, respectively.

* * * * *